(12) United States Patent
Miller et al.

(10) Patent No.: US 7,509,619 B1
(45) Date of Patent: Mar. 24, 2009

(54) AUTO GENERATION OF A MULTI-STAGED PROCESSING PIPELINE HARDWARE IMPLEMENTATION FOR DESIGNS CAPTURED IN HIGH LEVEL LANGUAGES

(75) Inventors: Ian D. Miller, Charlotte, NC (US); Jonathan C. Harris, Ellicott City, MD (US)

(73) Assignee: Xilinx, Inc., San Jose, CA (US)

( * ) Notice: Subject to any disclaimer, the term of this patent is extended or adjusted under 35 U.S.C. 154(b) by 415 days.

(21) Appl. No.: 11/159,085

(22) Filed: Jun. 22, 2005

(51) Int. Cl.
*G06F 17/50* (2006.01)
*G06F 9/44* (2006.01)
*G06F 9/45* (2006.01)

(52) U.S. Cl. .................. 716/18; 716/1; 716/3; 716/4; 716/5; 717/135; 717/136; 703/13; 703/17

(58) Field of Classification Search .............. 716/1, 716/3, 4, 5, 18; 717/135; 703/13, 14, 17
See application file for complete search history.

(56) References Cited

U.S. PATENT DOCUMENTS

| | | | |
|---|---|---|---|
| 6,263,302 B1 * | 7/2001 | Hellestrand et al. ........... | 703/17 |
| 6,625,797 B1 | 9/2003 | Edwards et al. | |
| 6,691,301 B2 * | 2/2004 | Bowen ........................ | 717/114 |
| 6,877,150 B1 | 4/2005 | Miller et al. | |
| 6,952,817 B1 * | 10/2005 | Harris et al. .................. | 716/18 |
| 6,964,029 B2 * | 11/2005 | Poznanovic et al. ............ | 716/7 |
| 7,143,388 B1 * | 11/2006 | Miller et al. .................. | 716/18 |
| 7,146,300 B2 * | 12/2006 | Zammit et al. ................. | 703/13 |
| 7,222,314 B1 | 5/2007 | Miller et al. | |
| 7,260,798 B2 * | 8/2007 | Gupta et al. ................... | 716/5 |
| 7,308,672 B2 * | 12/2007 | Waters et al. .................. | 716/18 |
| 2002/0019969 A1 * | 2/2002 | Hellestrand et al. ............ | 716/5 |
| 2002/0078255 A1 * | 6/2002 | Narayan ..................... | 709/316 |
| 2005/0193359 A1 * | 9/2005 | Gupta et al. ................... | 716/18 |
| 2007/0011627 A1 * | 1/2007 | Dennison et al. ............... | 716/1 |

OTHER PUBLICATIONS

U.S. Appl. No. 10/310,260, filed Dec. 4, 2002, Edwards et al.
U.S. Appl. No. 10/310,362, filed Dec. 4, 2002, Edwards et al.
Rajarshi Mukherjee et al.; "Handling Data Streams While Compiling C Programs Onto Hardware"; Proceedings of the IEEE Computer Society Annual Symposium on VLSI Emerging Trends in VLSI Systems Design; Copyright 2004 IEEE; pp. 1-2.
Arvind et al.; "High-Level Synthesis: An Essential Ingredient for Designing Complex ASICs"; pp. 1-8. 2004; IEEE/ACM International conference on CAD.
Celoxica; "Handel-C Language Reference Manual"; DK3 Version 3.0; available from www.celoxica.com; pp. 1-356, Jun. 22, 2005.

* cited by examiner

*Primary Examiner*—Helen Rossoshek
(74) *Attorney, Agent, or Firm*—Kevin T. Cuenot

(57) ABSTRACT

A method of creating a multi-staged hardware implementation based upon a high level language (HLL) program can include generating a language independent model (LIM) from the HLL program, wherein the LIM specifies a plurality of state resources and determining a first and last access to each of the plurality of state resources. The method further can include identifying a plurality of processing stages from the LIM, wherein each processing stage is defined by the first and last access to one of the plurality of state resources. A stall point can be included within the LIM for each of the first accesses. The LIM can be translated into a scheduled hardware description specifying the multi-staged hardware implementation.

19 Claims, 2 Drawing Sheets

AUTO GENERATION OF A MULTI-STAGED PROCESSING PIPELINE HARDWARE IMPLEMENTATION FOR DESIGNS CAPTURED IN HIGH LEVEL LANGUAGES

BACKGROUND

1. Field of the Invention

This invention relates to the field of integrated circuits and, more particularly, to generating a hardware description from a general purpose, high level programming language.

2. Description of the Related Art

The design of integrated circuits (ICs), digital logic intellectual property (IP), and particularly programmable logic devices (PLDs) such as field programmable gate arrays (FPGAs), typically begins with the development and validation of an algorithm which the IC is intended to implement. Presently, developers validate algorithmic designs by implementing algorithms in software programs written in a general purpose, high level language (HLL) such as C, C++, Java, or the like. HLLs provide designers with the ability to rapidly prototype an algorithm, explore the algorithm in further detail, and ultimately prove or validate that the algorithm is sufficient for the anticipated data processing for which the IC is being developed.

Once an algorithm has been validated, the HLL representation of the circuit design can be transformed into a hardware description of the circuit design using VERILOG, VHDL, or some other hardware description language alternative. Available software-based tools capable of performing such transformations generally attempt to map the HLL representation onto a particular target hardware architecture. One class of tools maps the HLL representation onto a hardware description which allows only a single data set to be processed at any given time. These architectures are referred to as "single process architectures", and are characterized by a single threaded controlling state machine. When the circuit design is invoked, one data set must be completely processed before processing can begin on a next data set.

To overcome this limitation, another class of tools has been developed which supports the creation of multi-staged processing implementations. These tools rely on the designer's explicit inclusion of pre-defined constructs within the HLL program. These constructs control functions such as data movement into and out of the HLL representation and its various modules and further define threads of execution within the HLL program. Each explicitly defined thread can be converted into a processing stage of the multi-staged hardware description. The constructs controlling data movement specify scheduling information for the processing stages. While the ability to create multi-staged hardware implementations using these constructs is useful, it requires the designer to explicitly define each processing stage within the HLL program.

Still other tools implement a technique called multiple statically scheduled wavefronts. This technique calls for analyzing a single process architecture to determine whether a new data set can be introduced into the hardware implementation prior to the complete processing of a previous data set. If possible, a determination is made as to when a new data set can be introduced, for example every "N" clock cycles. The value of "N" typically is a conservative value which ensures that data is not overwritten within the resulting hardware implementation when new data is introduced. While designs created using this technique are more efficient than single process architectures, inefficiencies do exist. In particular, some data sets may be processed earlier than the value of "N" would otherwise allow. The hardware implementation, however, is unable to dynamically adjust to allow such new data sets to be processed earlier than the "N" clock cycle limitation.

It would be beneficial to provide a technique for developing a multi-staged hardware implementation from an HLL program in a manner that overcomes the limitations described above.

SUMMARY OF THE INVENTION

One embodiment of the present invention can include a method of creating a multi-staged hardware implementation based upon a high level language (HLL) program. The method can include generating a language independent model (LIM) from the HLL program, wherein the LIM specifies a plurality of state resources, and for each of the plurality of state resources, determining a first and last access. The method also can include identifying a plurality of processing stages from the LIM, wherein each processing stage is defined by a first and last access to one of the plurality of state resources. A stall point for each of the first accesses can be included within the LIM. The LIM can be translated into a scheduled hardware description specifying the multi-staged hardware implementation.

The identifying step can include finding all nodes which derive an input from a first access of a processing stage and including the nodes within the processing stage from which the nodes derive the input. The method also can include defining a stall release signal corresponding to the completion of each of the last accesses. Selected ones of the stall points and the stall release signals can be communicatively linked to facilitate reverse flow control through the hardware implementation.

For each processing stage, each stall release signal of the processing stage can be connected to an input of the stall point of the same processing stage. The method also can include identifying nodes within each processing stage which consume data derived from a different processing stage, defining a second stall release signal corresponding to the completion of each identified node, and connecting each second release signal to the stall point corresponding to the different processing stage. Accordingly, processing of a data set by the different processing stage can be deferred until data input to the different processing stage is valid and each stall release signal connected to the stall point of the different processing stage is provided.

The processing of a data set by a selected processing stage can be deferred until data input to the selected processing stage is valid and a stall release signal corresponding to a last access of the selected processing stage is provided to a stall point corresponding to the first access of the selected processing stage.

In one embodiment, where a last access is located within a body of a loop construct and the loop construct has loop control logic, the including step can include placing additional logic within the body of the loop construct which determines whether an iteration of the body of the loop construct is a last iteration. If the iteration of the body is the last iteration, the additional logic can cause a stall release signal to be generated.

In another embodiment, where a last access is disposed within a body of a loop construct, the including step can include modifying the loop construct to execute the body one less time and adding a separate instance of the body of the loop construct, such that the stall release signal is defined by the last access within the separate instance of the body.

Another embodiment of the present invention can include a method of creating a hardware implementation having a multi-staged processing pipeline based upon a HLL program. The method can include creating a LIM of the HLL program, dividing the LIM into a plurality of processing stages, and including within the LIM at least one stall point for each of the plurality of processing stages. The stall points can coordinate reverse flow control among the plurality of processing stages. The method also can include translating the LIM into a hardware description of the circuit design.

The dividing step can include identifying a plurality of state resources, such that each processing stage is associated with at least one of the plurality of state resources. The method also can include allowing data to propagate into a selected processing stage from a prior processing stage when a stall point associated with the selected processing stage determines that a state resource of the selected processing stage has been released.

The including step also can include locating a stall point prior to a first access of a state resource associated with a selected processing stage and defining a stall release signal corresponding to a completion of execution of a last access of the state resource associated with the selected processing stage. The stall release signal can be provided at least to the stall point for the selected processing stage.

Yet another embodiment of the present invention can include a method of implementing reverse flow control for a circuit design based upon a HLL representation of the circuit design. The method can include creating a LIM of the HLL representation of the circuit design, identifying a plurality of processing stages of the LIM, wherein each processing stage is associated with at least one state resource, and including within the LIM at least one stall point for each processing stage. The LIM can be translated into a scheduled circuit design.

Accordingly, each stall point can be converted into a hardware description of a stall circuit and selected ones of the stall circuits can communicate to facilitate concurrent processing of multiple data sets within the processing stages. The hardware description of the stall circuit can specify a time independent AND gate.

The including step can include, for each processing stage, identifying a first access and a last access to the associated state resource. For each processing stage, the method can include, inserting a stall point before the first access to the associated state resource of the processing stage and creating a stall release signal corresponding to a completion of execution of the last access to the associated state resource of the processing stage.

The including step can include linking a plurality of control paths to inputs of a stall point of a selected processing stage, wherein at least one control path indicates validity of data input to the selected processing stage and at least one other control path is a stall release signal indicating a status of the state resource of the selected processing stage. The stall point of the selected processing stage can allow a new data set to propagate to the state resource after receiving an indication that the state resource has been released and that data provided to the selected processing stage is valid, wherein the indication is the stall release signal.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

The present invention provides a solution for developing multi-staged hardware implementations. More particularly, the present invention can automatically generate a hardware implementation of a multi-staged processing pipeline based upon a general-purpose, high level language (HLL) program. The HLL program can implement a data processing function which can be implemented within an integrated circuit, such as a programmable logic device.

In accordance with the inventive arrangements, the HLL program, or HLL representation of an algorithm, can be processed into a circuit design using a compiler or other software-based design tool. An analysis of the HLL program can be performed in which the HLL program is translated into an intermediate format that is hardware neutral. This representation further can be analyzed with respect to state resources and accesses to the state resources. State resources can include, but are not limited to, memories, registers, queues, Intellectual Property (IP) cores, hardware IP blocks, interfaces, any circuit that can maintain a state, and the like.

Based upon the state resources, processing stages of the HLL program can be identified. Further, stall points and stall release signals can be inserted into the intermediate representation of the HLL program for the different processing stages. In general, a stall release signal indicates that a last access to a state resources has occurred or been executed. The stall release signals can be provided to the stall points which generally precede accesses to the state resources. The combination of stall points and stall release signals function cooperatively to defer the propagation of a data set into a given processing stage until that stage is ready to receive data.

The intermediate representation of the HLL program can be scheduled, including the stall points and stall release signals, thereby facilitating reverse flow control through the design. The stall points and stall release signals effectively provide real-time reactive control over the flow of data through the processing stages of the circuit design. In other words, these structures provide for reverse flow control through the processing stages from the output(s), back through the input(s) of the design. This allows multiple data sets to be processed concurrently as described herein.

The HLL program ultimately is translated into a description of the circuit hardware such as a netlist or a hardware description language (HDL) representation of the circuit design (hereafter collectively "HDL representation"). The HDL representation can define a multi-staged hardware implementation of the HLL program that is capable of processing more than one data set concurrently. As noted, the resulting architecture is reactive, in real-time, to the conditions in which the hardware implementation will operate.

Figure 1:
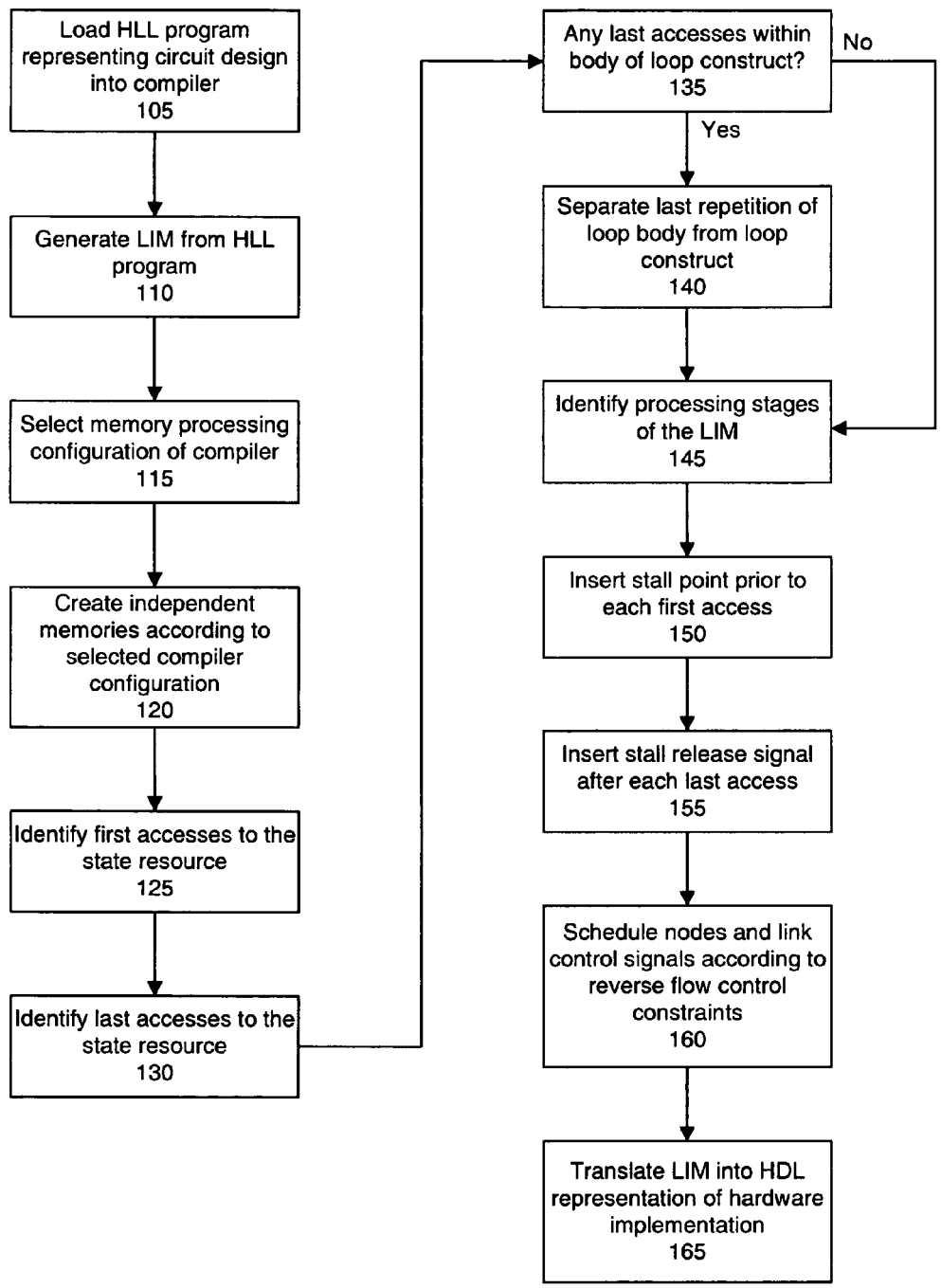
FIG. 1 is a flow chart illustrating a method of creating a multi-staged, pipelined hardware implementation based upon a high level language representation of a circuit design in accordance with the inventive arrangements disclosed herein.

FIG. 1 is a flow chart illustrating a method of creating a multi-staged, pipelined hardware implementation based upon a HLL representation of a circuit design in accordance with the inventive arrangements disclosed herein. From the HLL program, an HDL representation of a circuit design can be derived. The HDL representation can specify a hardware implementation having a multi-staged, pipelined architecture. In one embodiment, the present invention can be implemented within a compiler configured to process a HLL as described herein. For example, the present invention can be implemented as part of the Forge compiler for HLL design, available from Xilinx, Inc. of San Jose, Calif. In any case, the method can begin in step 105 where an HLL program is loaded into a compiler.

In step 110, the compiler can process the HLL program to generate a language independent model (LIM) of the HLL program. In general, a LIM is a programming language neutral and hardware neutral representation of a program and the corresponding program structure. A LIM is based upon the premise that many general-purpose HLLs share a similar, if not equivalent, set of basic programming constructs for expressing logic. These basic programming constructs can include operations, whether arithmetic, logical, and/or bitwise, sequences, branches, loops, memory assignments and references, other state modifying or referencing operations, compound statements, and subroutine calls.

In cases where more complex programming constructs exist, the complex programming constructs typically can be reduced to a set of equivalent primitives or less complex programming constructs. The LIM provides a hierarchical, abstract representation of these programming constructs. In one embodiment, the LIM can be implemented as a Control Data Flow Graph (CDFG). A CDFG implementation includes nodes which represent the operations of the HLL program, and paths representing logical directed relationships between the nodes.

Creation of the LIM can be summarized in several general steps which include parsing the HLL program into a hierarchical set of nodes, determining flow control through the nodes, and determining data flows through the nodes. To parse the HLL program into a hierarchy of nodes, the compiler maps each syntactic construct of the HLL program to one or more LIM nodes. Each node refers to a unit of functionality. Each node can represent a primitive, which refers to an atomic unit of functionality, i.e. a low level "black box", or a module, which refers to a container or collection of other nodes. In illustration, an "if" statement can cause a branch node to be produced. The branch node may have a true and a false node, and each node may represent a single operation or a module.

It should be appreciated that a module, which is formed of a plurality of nodes, also can be represented as a node. Thus, the LIM can be hierarchically nested to an arbitrary depth. Different types of modules can exist which represent or correspond to different programming constructs. For example, common module types can include block modules, branch modules, and loop modules. A block module represents an ordered sequence of nodes. A branch module specifies the execution of one node or another based upon the value of a node which computes a conditional value. A loop module executes a body node iteratively until a conditional node produces a termination condition.

Flow control, which defines the logical order in which the various nodes of the LIM execute, can be determined. The nodes of the LIM can be connected via a set of one or more control paths which specify the sequential ordering of the nodes. The LIM can include at least one control path which connects one node to the next, thereby mapping the order in which the nodes execute. It should be appreciated that a control path may split to indicate alternative paths, or may split to indicate parallel simultaneous paths to be taken.

Data flows into and out of each of the LIM nodes also can be determined. By following the flow control through the LIM and decomposing symbolic references from the original source code, the flow of data into and out of each node or module can be charted. Data paths between nodes can be created which indicate the relationships between data producers, which are nodes representing operations that create a data result, and data consumers, which are nodes representing operations which receive a data value as input and operate on that data value.

Data dependency information among paths and/or nodes of the LIM can be annotated on the appropriate nodes. A data dependency indicates the source node of a data value that is needed by another node before that node can begin execution. For each data value required by a node, a separate data dependency exists, and therefore, can be recorded for each different flow control path leading to the node. Using information obtained from the source code, each data flow also can be annotated with size information, a static initial value if one exists, and a type.

One of the most common state resources encountered is a memory. Because each state resource, and consequently each memory, is a determining factor in the resulting performance of the hardware implementation, significant compiler time is spent on optimizations related to memories as described herein. As noted, state resources can include, but are not limited to, memories, IP cores, shared hardware IP blocks, interfaces, and the like.

In step 115, a memory processing configuration for the compiler can be selected. The compiler configuration determines the degree, or level, of memory decomposition and analysis of the LIM that is performed. In general, a memory is used to maintain state and collect data elements together for processing. A memory can be randomly accessed and provide storage for intermediate, or calculated, results. In accordance with the present invention, memory access patterns can be analyzed to allocate multiple, smaller independent memories for variables, portions of the stack, heap, etc., rather than using a single larger memory for the entire design. This results in a LIM in which the various memories can be accessed in parallel, or concurrently, as well as independently of one another.

As will be described in greater detail, the LIM is subdivided into one or more processing stages based, at least in part, upon the determined or allocated memories and/or other state resources and the accesses to those resources. Each processing stage can serve as the basis for a pipelined stage of the hardware implementation. As such, the number of pipelined stages in the hardware implementation is directly related to the number of independent memories and other state resources allocated in the LIM. Thus, the resulting multi-staged hardware implementation depends upon the memory processing performed by the compiler, i.e. the degree of memory decomposition.

Accordingly, different compiler configurations can be made available which produce different hardware implementations. These hardware implementations range from shallow architectures with fewer memories, and thus, fewer processing stages, to deeper architectures with more memories, and therefore, more processing stages. In illustration, one configuration of the compiler may be intended to generate a deeper implementation and can perform a full decomposition of the memory. In such a configuration, the compiler can allocate an independent memory for sub-ranges of a declared variable. Thus, in an HLL description, if a declared global variable is a structure with 3 fields, the compiler can allocate 3 memories.

In another configuration, the compiler can generate an intermediate architecture where the memory is decomposed, or subdivided, down to the declared variable size, but no further. With reference to the previous example, this configuration would allocate a single memory to contain all 3 fields of the 3-field variable structure. It should be appreciated that any of a variety of different compiler configurations can be selected, with each performing a different level of memory decomposition.

In one embodiment, the selection of the compiler configuration can be made manually by a user. In that case, the compiler can present the user with a range of profiles. Each profile can be associated with a particular compiler configuration. Each profile can indicate expected values for parameters of the hardware implementation such as throughput, latency, area, maximum operating frequency, and the like. Selection of a particular profile in turn selects the associated compiler configuration to be used. As noted, the compiler configuration generally controls the depth of the processing stages created.

In another embodiment, the compiler configuration can be automatically selected by the compiler itself. The selection can be made based upon user supplied criteria relating to parameters such as target throughput, latency, operating frequency, area, and the like. Any subset of the criteria can be supplied by the user such that the compiler selects a configuration which is considered most likely to generate a hardware implementation that conforms with the user specified criteria. If the user supplied criteria cannot be met, the compiler can select a compiler configuration which will produce a hardware implementation that most closely matches, or approximates, the user specified criteria. In any case, in step 120, a plurality of independent memories can be created and/or allocated for the LIM based upon the selected compiler configuration.

In addition to optimizations which modify the number and types of memories allocated in the LIM, other optimizations can be applied which address other types of state resources. In the case of shared hardware IP blocks, if sufficient implementation resources are available in the target technology for the hardware implementation, the IP block may be replicated one or more times. Accesses to the resource can be re-allocated to one of the copies of the IP block in such a way as to ensure that multiple accesses which represent one "invocation" of the state resource are grouped onto the same copy of the resource.

Once the LIM is created and the state resources have been optimized, block scheduling can be performed. Block scheduling is one aspect of the process of LIM scheduling. LIM scheduling refers to the process of inserting timed elements into the LIM in order to ensure data validity at the inputs to each node and to further arbitrate any state resources such that all accesses are guaranteed to succeed. This arbitration can be accomplished through insertion of delay elements so that each access to state resources, such as memories, executes in a distinct clock cycle.

Block scheduling refers to the process of making the LIM more aware of the movement and processing of data sets through the LIM nodes. The primary purpose of block scheduling is to facilitate the processing of multiple data sets within the implementation concurrently. Independent portions of the resulting hardware implementation will be available for processing different data sets at a given time. As such, block scheduling does not refer to the duplication of logic to process multiple data sets concurrently, but rather to pipelining a design. Block scheduling ensures that a data set is processed as soon as the state resources required for a given processing stage of the design are no longer in use for the processing of a prior data set.

In order to process multiple data sets concurrently within a hardware implementation, various constraints must be observed during scheduling of the LIM. One such constraint is that each state resource must be reserved for a single data set. This means that all accesses to the state resources, in support of processing a given data set, must be accomplished and complete before any accesses in support of processing a second data set occur. It is not necessary, however, to reserve two state resources for a same data set simultaneously. This constraint presupposes that there is independence between the two state resources. Memories, one type of state resource, can be said to be independent of one another when any given memory access targets at most a single memory. If there exists, within the LIM, a memory access which targets multiple memories, those memories may be jointly considered as one single state resource for the purposes of identifying processes and block scheduling.

In addition to state resource independence, another necessary constraint is that each processing stage must process data sets in the same order. This results in each state resource being used in support of the processing of incoming data sets in order.

Local data flows within the LIM can be considered to be a degenerate case of state resource processing. In contrast to other state resources, local data flows are represented as data dependencies within the LIM instead of accesses to a resource. As such, local data flows are implemented as wires between operations. Local data flows, however, still must adhere to the same general set of restrictions that are imposed upon general state resources. In particular, local data flows must process data sets in the order in which the data sets are received. The scheduling of the hardware implementation must ensure that a given local data flow contains intermediate results from only one data set at a time. In order to hold intermediate results, such as to ensure data validity when a stall point to be described herein is protecting a section of the implementation, a latch or data register can be inserted into a given data flow as necessary to guarantee data validity on the inputs of the consuming operation or node.

In step 125, the set of all possible first accesses to state resources can be identified. Accordingly, the first node, or first nodes, to access a memory, an interface, and/or a shared hardware IP block can be identified for a given processing sequence, i.e. in reference to processing a given data set. In step 130, last accesses to each state resource can be identified. Thus, any last accesses to a memory, interface, and/or shared IP block for a given processing sequence in reference to a data set can be identified. For a given state resource there may be multiple last accesses which may exist in mutually exclusive control paths. Thus, each potential last access must be identified. In consequence, there may be multiple stall release signals, each qualified by a corresponding control path.

By identifying the first and last accesses to state resources, reverse flow control can be implemented and used to regulate the activation or activity of different processing stages of the design. This facilitates concurrent processing of multiple data sets. Reverse flow control can be implemented as a control channel that is capable of indicating to a data generating operation the availability of data storage for its results. Reverse flow control ensures that a next data set will not corrupt any data from the current data set given the finite buffering resources of a hardware implementation.

Reverse flow control guarantees that each state resource is only used in support of the processing of a single data set at any one time. For memory resources this means that only one data set resides in a memory at a given time. For interfaces, this means that all the accesses to that interface for a given data set must complete before any accesses related to the next data set occur. This feature, referred to as "atomicity", is guaranteed by deferring the processing of a next data set until the prior data set has completed execution within a given processing stage. This can be accomplished by ensuring that once a data set has executed its first access to a state resource within a given processing stage, the next data set cannot execute any access to the same resource until the first data set has executed its last access to the resource. In general, a process is defined by the set of possible first accesses and the set of possible last accesses, as well as any logic that is executed between the two accesses.

Conventional compilers create control signals for each operation of the LIM. These control signals indicate when the inputs and outputs of the operation represented by a node are valid. In accordance with the inventive arrangements disclosed herein, further constructs can be automatically included within the LIM which guarantee the atomicity of a state resource accessed by a given processing chain. The LIM construct that can be inserted, referred to as a stall point, represents a stall circuit to be described herein in greater detail.

Steps 135 and 140 are optional steps illustrating an optimization that can be performed in some circumstances. It should be appreciated that the optimizations disclosed herein can be performed upon the LIM, but for purposes of illustration, have been shown with reference to the source code of the HLL program. Table 1 below illustrates the case where the last access to a state resource occurs within a body of a loop construct. In such cases, a stall release signal, which indicates that a last access to a state resources has occurred or been executed, would be generated immediately after the loop construct as shown. If, however, the body of the loop construct includes a significant amount of logic following the last access, all of that logic would need to execute before the stall release signal were triggered. This can delay the processing of a next data set by the processing stage as the next data set would not be loaded into the state resource until the stall release signal is provided, despite the last access to the state resource having occurred with respect to a prior data set.

TABLE 1

Example Loop Construct

```
(int i=0; i<x; i++)
{                               // Beginning of loop body
    <access to state resource>
    <logic 1>
    <logic 2>
    •
    •
    •
    <logic N>                   // End of loop body
}
<stall release signal>
```

By unrolling the last iteration of the loop construct in such cases, and generating the stall release signal immediately after the last access within the body of the unrolled loop, the stall release signal can be generated as soon as the last access is performed. Thus, while the remaining logic continues to execute, a next data set can be introduced into the processing stage since the state resource is available as it is no longer in use by the current data set.

Thus, in step 135, a determination can be made as to whether any last accesses are within a body of a loop construct where at least a minimum amount of logic follows the last access within the body. The amount of logic can be measured in terms of clock cycles required for execution, the number of statements or nodes, or some other metric. If the last access is within a loop construct and a minimum amount of logic follows the last access, the method can continue to step 140.

In step 140, the last iteration of the body of the loop construct can be unrolled, or "peeled off" from the loop construct. Table 2 below shows exemplary pseudo code after the last iteration of the loop construct has been unrolled. The last iteration of the body of the loop construct has been removed from the loop construct and included as a portion of independent code. Accordingly, the number of iterations of the loop has been reduced from "x" to "x−1". By unrolling the loop construct, the stall release signal can be inserted immediately after the last access to the state resource. This allows a next data set to propagate into a processing stage and utilize the loop as well as the state resource of the processing stage while the remainder of the logic executes. If not unrolled as shown, the processing of a next data set would be delayed until the logic within the loop body finished execution.

TABLE 2

Example of Unrolled Loop Construct

```
(int i=0; i<x-1; i++)
{
    <access to state resource>      // Beginning of loop body
    <logic 1>
    <logic 2>
    •
    •
    •
    <logic N>                        // End of loop body
}
<access to state resource>           // Beginning of last iteration of loop body
<stall release signal>
<logic 1>
<logic 2>
•
•
•
<logic N>
```

With regard to step 140, an alternate optimization can be performed. Specifically, a determination can be made as to whether the amount of logic generated through the unrolling of the last iteration of the loop exceeds a threshold. If exceeded, additional logic can be inserted before the access to the state resource. The additional logic can, in general, replicate the decision made by the loop control circuitry. The additional logic determines if the current iteration is the last iteration, and if so, causes the generation of the stall release signal by the successful completion of the last access. This optimization realizes some of the benefit of the optimization illustrated in Table 2 by allowing a processing stage to begin processing the next data set but does not free the entire loop control logic for the next data set until normal completion of the loop.

In step 145, one or more processing stages of the LIM can be identified. The processing stages can be identified based upon first and last accesses to state resources. By dividing the LIM into a plurality of different processing stages, reverse flow control can be provided which begins at the output channel(s) of the hardware implementation and extends back through the implementation to the input channel(s). Each processing stage can be defined by a state resource and the accesses to that state resource. As noted, a state resource can include, but is not limited to, a memory, an interface to a hardware implementation that is to be external to the integrated circuit (IC) being developed, and/or a critical or limited hardware resource such as hardware IP or a Digital Signal Processing (DSP) block.

In any case, the processing stages can be defined by a state resource and the logic that is associated with accessing the state resource or generating intermediate results based upon accesses to the state resource. It should be recognized that logic can be shared among multiple processing stages depending on the data processing specified by the algorithm. In particular cases some logic can be shared, while in others all logic of a given processing stage can be shared.

The division of the LIM into a plurality of processing stages can result in a variety of different multi-staged, pipelined architectures. One architecture can be a linear processing chain where data is passed from one processing stage to the next. Another architecture can be one in which multiple processing stages are implemented in parallel and data from the stages is merged to flow into a single processing stage. Such can be the case when a system has multiple independent input channels and only a single output channel. Still another architecture is one in which multiple independent and parallel processing stages are implemented. Such is the case when a system has multiple independent input channels and multiple independent output channels.

In step 150, a stall point can be inserted proximate to each identified first access. Specifically, the stall point can be inserted immediately prior to each first access in such a way as to qualify the execution of the first access. A stall point ensures that when control passes that point within the LIM, a next control signal, or processing wavefront, will be captured by the stall point until one or more stall release signals are received. The atomicity of a given state resource can be maintained by inserting a stall point within the processing stage that accesses the state resource. The stall point is inserted prior to the first access of the state resource within the processing chain, and qualifies the conditions under which that first access may execute. The remaining logic within the processing stage will consequently be stalled, due to either control or data dependencies on the first access, by LIM scheduling. Further, this stall condition can propagate back through prior stages of the design thereby providing for real-time reactive flow control.

In step 155, a stall release signal can be inserted after each last access. The control signal which identifies the successful execution of the last access to the state resource within the processing chain is identified as the stall release signal for that state resource. Accordingly, the release signal for a stall point of a processing stage that corresponds to the first access to the state resource can be the reception of the stall release signal corresponding to the state resource of the same processing stage.

It should be appreciated that the structures necessary for generating stall release signals commonly are included within the LIM as part of the scheduling process. These structures, and the signals being generated, can be used in the additional context of stall release signals as disclosed herein. Accordingly, if not already included within the LIM, constructs for generating the stall release signals can be included. Such structures can be included immediately after each last access, or as otherwise described herein.

Including stall points and stall release signals within the processing stages in this manner allows a next data set to be processed up to the point of a first access to a state resource. If a prior data set has already passed that point, the control signal encounters the stall point and is captured since the stall point indicates that the state resource is busy or occupied with a prior data set. When the stall release signal is received by the stall point associated with the first access to the state resource, the next data set is allowed to propagate into the processing stage. Once that data set propagates into the processing stage, the stall point associated with the first access can be set to busy. This process can repeat for further data sets. Thus, each data set is processed until a busy stall point is encountered, thereby permitting each data set to be processed as fully as possible given the current state of all downstream state resources.

Generally, the processing stages can be scheduled to begin execution so that each processing stage in the implementation consumes a next data set as soon as the state resource is no longer in use by the prior data set. For example, when a memory is the state resource, the processing stage can begin to consume the next data set as soon as there is sufficient space, which is not in use or occupied by a prior data set, in the memory, thereby resulting in concurrent processing of multiple data sets. If sufficient buffering were available between each operation, every operation could execute whenever its inputs were available. Frequently, the availability of this amount of buffer space is not available within reasonable system implementations. Further, output channels can stall from time to time, which could ultimately result in overflow of the buffers.

In step 160, any remaining nodes of the LIM can be scheduled and any control signals can be linked in accordance with reverse flow control constraints. The LIM can be scheduled, particularly with respect to the stall points, in accordance with the constraints described herein. In scheduling, it should be appreciated that a given processing stage includes a state resource as well as all of the logic that is executed between the first and last accesses to the state resource. This ensures that any logic that is a consumer of data from logic within the same processing stage will not be placed into contention with one another.

In step 165, the LIM can be translated into an HDL representation of the hardware implementation. The HDL representation can describe a multi-staged, pipelined hardware implementation of the circuit design. The stall points can be translated into HDL constructs specifying stall circuits. In one embodiment, the stall circuits can be implemented as time independent AND gates. Accordingly, a stall circuit can have two different types of inputs. The primary inputs to the stall circuit indicate the conditions under which the stall circuit would be activated in the absence of any reverse flow control. That is, the primary inputs can be conventional control signals which indicate that control flow has reached the node and which also indicate the presence and validity of any data provided as input to the processing stage.

The secondary inputs of the stall circuit can be stall release signal inputs. The stall release signals can indicate when a downstream contention for a state resource has been cleared. The time independent AND gate does not become active until each of the primary input(s) and secondary input(s) become active at some point during a given cycle. The primary and secondary inputs need not be active concurrently, so long as each is active at some point within defined operational cycle, i.e. between an initialization or reset of the stall circuit and a next reset of the stall circuit.

Because the secondary inputs provide for reverse flow control, it is necessary to initialize the secondary inputs at or before startup. The secondary inputs can be initialized to an active state to indicate that any protected state resource is available. Thus, immediately after initialization, the stall circuit can be activated through activation of the primary inputs only, as the secondary inputs have already been initialized to active. After the first activation of the stall circuit, the stall circuit can be reset or cleared. Accordingly, a subsequent activation will require both the primary and secondary input(s) to become active.

The method disclosed herein has been provided for purposes of illustration only. As such, it should be appreciated that one or more steps of the method can be performed in a different order than specified without departing from the spirit of the present invention. For example, in an alternate embodiment, first accesses can be identified and stall points can be inserted prior to identification of last accesses to state resources. Other variations also are within the scope of the present invention.

Figure 2:
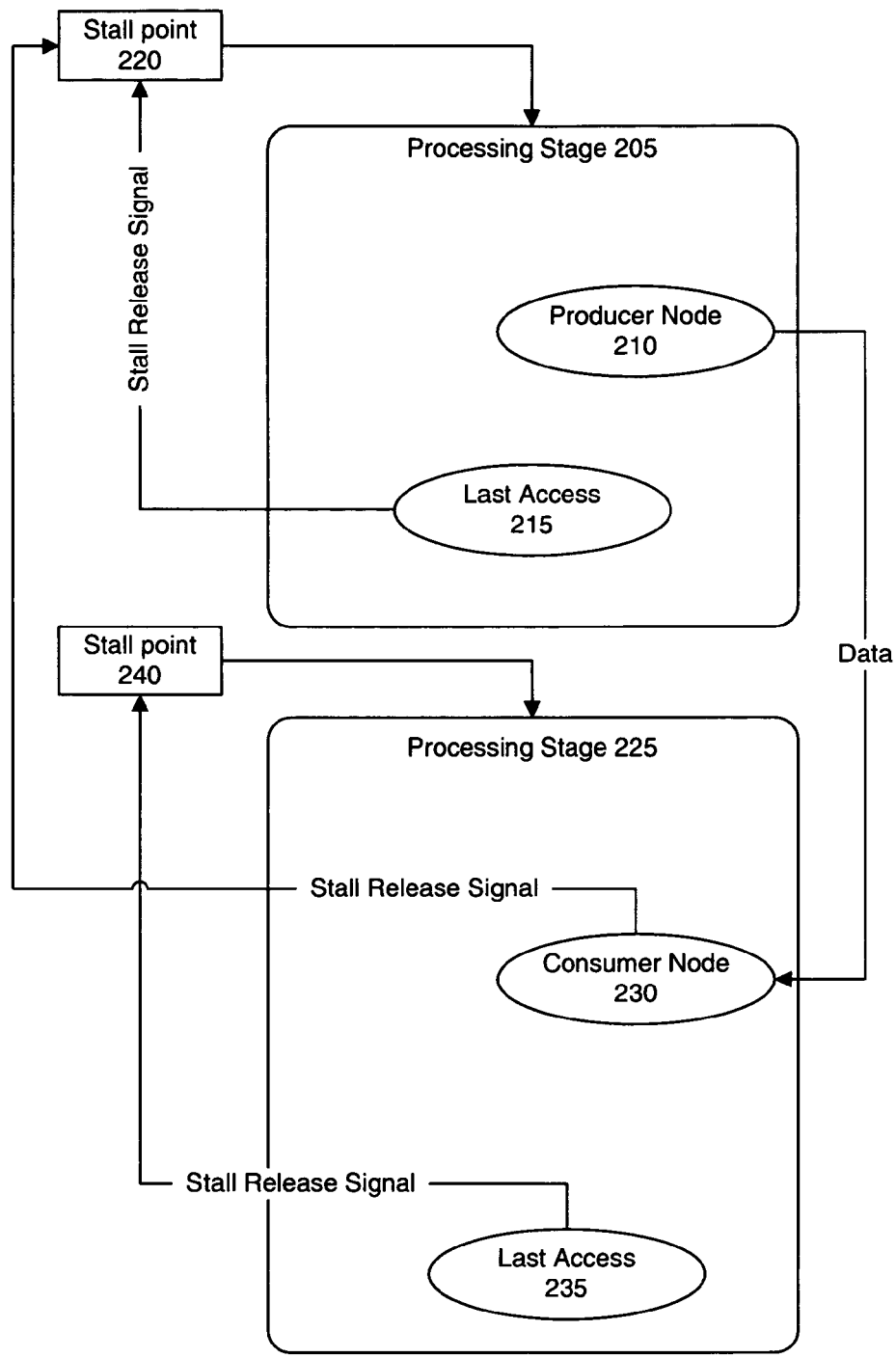
FIG. 2 is a block diagram illustrating another aspect of block scheduling in accordance with the inventive arrangements disclosed herein.

FIG. 2 is a block diagram illustrating another aspect of block scheduling in accordance with the inventive arrangements disclosed herein. As noted, during scheduling, a given processing stage includes a state resource as well as all of the logic that is executed between the first and last accesses to the state resource. This ensures that any logic that is a consumer of data from logic within the same processing stage will not be placed into contention with one another. Such is not the case, however, for logic that is disposed within one processing stage, but consumes data from logic that is disposed within a different processing stage. In this situation, the consuming logic may be currently processing data set "N", while the data producer potentially is currently processing data set "N+1". Here, scheduling must ensure that the data flow from the producer to the consumer is not placed under contention. More specifically, the value held by the data flow must remain valid until such time as the consumer is able to process it.

FIG. 2 depicts a processing stage 205 having a data producer node 210, a last access node 215 to a state resource, and a stall point 220. Processing stage 225 has a data consumer node 230, a last access node 235 to a state resource, and a stall point 240. As shown, data consumer node 230 in processing stage 225 consumes data from data producer node 210 of processing stage 205. Processing stage 225 can be independently stalled with respect to processing stage 205. In order to preserve the data on the data flow from producer node 210 to consumer node 230, processing stage 225 must remain stalled until consuming node 230 has consumed the value or data from producer node 210. Effectively, the stall release signal becomes the later of the last access complete signal and the successful completion of the consumer node 230 indicated by the stall release signal sent therefrom. Contention is avoided by ensuring that each producer node 210 that generates a local data flow which is consumed by a consumer node 230 in a different processing stage 225 causes a stall release signal to be applied to the stall point 220 of the generating processing stage 205. This guarantees that the generating logic will not advance to processing the next data set until all of its generated intermediate results are consumed.

In another embodiment of the present invention, an optimization can be applied in cases as described above. A first-in-first-out (FIFO) memory can be inserted between the data producer and the data consumer. The addition of a FIFO memory effectively increases the depth of the communication channel between the data producer and the data consumer, thereby decoupling the two processing stages. If a FIFO memory is included, the stall signal to the generating process can be the "full" flag of the FIFO memory. The data producer can generate the write signal to the FIFO when the data is calculated and the data consumer can generate a read signal to the FIFO when the data is consumed.

Full reverse flow control is further assured by insertion of an additional stall point within the LIM when a local data flow is created by logic that is not under the control of any other stall point. This additional stall point is used to satisfy the same condition as described herein, particularly that a data consumer node must be able to stall a data producer node which is not contained within the same processing stage. The producing logic in this case is not contained in any processing stage. Thus a stall point is inserted before the producing logic and that stall point receives a stall release signal from the data consumer node.

Similarly, any processing stage which shares no nodes with another processing stage and which consumes no data from a prior processing stage, causes an additional, explicit, reverse flow control path to be inserted. In this case, the given processing stage has no ability to stall a prior process because there is no sharing of control or data flow from a prior processing stage to the current processing stage. In this case the commencement of execution of the current processing stage, i.e. the activation of the stall point which controls the current processing stage, is used as a stall release signal for an arbitrary prior processing stage.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program, software, application, or any variant thereof, in the present context, means any expression, in any language, code or notation, of a set of instructions intended to cause a system having an information processing capability to perform a particular function either directly or after either or both of the following: a) conversion to another language, code, or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of creating a multi-staged circuit design from a high level language (HLL) program specifying an algorithm to be implemented as a circuit, said method comprising:
   generating a language independent model (LIM) from the HLL program by, at least in part, representing selected instructions of the HLL program as state resources within the LIM;
   determining a first and last access to each of the plurality of state resources within the LIM;
   identifying a plurality of processing stages from the LIM, wherein each processing stage is defined by a first and last access to one of the plurality of state resources;
   including within the LIM, a stall point for each of the first accesses, wherein the stall point represents stall circuitry, wherein a last access is disposed within a body of a loop construct, said including step further comprising modifying the loop construct to execute the body one less time and adding a separate instance of the body of the loop construct, such that a stall release signal is defined by the last access within the separate instance of the body; and translating the LIM into a scheduled hardware description specifying the multi-staged circuit design specifying stall circuitry according to the stall points.

2. The method of claim 1, said identifying step further comprising finding all nodes which derive an input from a first access of a processing stage and including the nodes within the processing stage from which the nodes derive the input.

3. The method of claim 1, further comprising defining a stall release signal corresponding to the completion of each of the last accesses.

4. The method of claim 3, further comprising deferring processing of a data set by a selected processing stage until data input to the selected processing stage is valid and a stall release signal corresponding to a last access of the selected processing stage is provided to a stall point corresponding to the first access of the selected processing stage.

5. The method of claim 3, further comprising, for each processing stage, connecting each stall release signal of the processing stage to an input of the stall point of the same processing stage.

6. The method of claim 5, further comprising:
identifying nodes within each processing stage which consume data derived from a different processing stage;
defining a second stall release signal corresponding to the completion of each identified node; and
connecting each second release signal to the stall point corresponding to the different processing stage.

7. The method of claim 6, further comprising deferring processing of a data set by the different processing stage until data input to the different processing stage is valid and each stall release signal connected to the stall point corresponding to the different processing stage is provided.

8. The method of claim 3, wherein selected ones of the stall points and the stall release signals are communicatively linked to facilitate reverse flow control through the multi-staged circuit design.

9. The method of claim 1, wherein a last access is located within a body of a loop construct, wherein the loop construct has loop control logic, said including step further comprising placing additional logic within the body of the loop construct which determines whether an iteration of the body of the loop construct is a last iteration, wherein the additional logic causes a stall release signal to be generated if the iteration of the body is the last iteration.

10. A method of creating a circuit design comprising a multi-staged processing pipeline from a high level language (HLL) program specifying an algorithm to be implemented as a circuit, said method comprising:
creating a language independent model (LIM) of the HLL program;
dividing the LIM into a plurality of processing stages, wherein each of the Plurality of processing stages is associated with a state resource and is defined by a first access and a last access to one of the plurality of state resources;
including within the LIM at least one stall point for each of the plurality of processing stages, wherein the stall points represent stall circuitry and coordinate reverse flow control among the plurality of processing stages, wherein a last access is disposed within a body of a loop construct, said including step further comprising modifying the loop construct to execute the body one less time and adding a separate instance of the body of the loop construct, such that a stall release signal is defined by the last access within the separate instance of the body; and
translating the LIM into a hardware description of the circuit design specifying stall circuitry according to the stall points, wherein the plurality of processing stages comprise the multi-staged processing pipeline.

11. The method of claim 10, said creating a LIM of the HLL program comprising selecting a memory decomposition setting from a plurality of memory decomposition settings, wherein each memory decomposition setting specifies a different memory decomposition depth, wherein the memory decomposition depth of the selected memory decomposition setting determines a number of the plurality of state resources identified from the HLL program and a number of the plurality of processing stages.

12. The method of claim 11, further comprising allowing data to propagate into a selected processing stage from a prior processing stage when a stall point associated with the selected processing stage determines that a state resource of the selected processing stage has been released.

13. The method of claim 11, said including step further comprising:
locating a stall point prior to a first access of a state resource associated with a selected processing stage; and
defining a stall release signal corresponding to a completion of execution of a last access of the state resource associated with the selected processing stage, wherein the stall release signal is provided at least to the stall point for the selected processing stage.

14. A method of implementing reverse flow control for a circuit design comprising:
creating a language independent model (LIM) from a high level language (HLL) program specifying an algorithm to be implemented as a circuit;
identifying a plurality of processing stages of the LIM, wherein each processing stage is associated with at least one state resource and is defined by a first access and a last access to the at least one state resource;
including within the LIM at least one stall point for each processing stage, wherein a last access is disposed within a body of a loop construct, said including step further comprising modifying the loop construct to execute the body one less time and adding a separate instance of the body of the loop construct, such that a stall release signal is defined by the last access within the separate instance of the body; and
translating the LIM into a scheduled circuit design, wherein each stall point is converted into a hardware description of a stall circuit and selected ones of the stall circuits communicate to facilitate concurrent processing of multiple data sets within the processing stages.

15. The method of claim 14, wherein the LIM is implemented as a control data flow graph comprising nodes representing operations of the HLL program and paths representing logical directed relationships between the nodes.

16. The method of claim 15, said including step further comprising, for each processing stage:
inserting a stall point before the first access to the associated resource of the processing stage; and
creating a stall release signal corresponding to a completion of execution of the last access to the associated resource of the processing stage.

17. The method of claim 16, said including step further comprising linking a plurality of control paths to inputs of a stall point of a selected processing stage, wherein at least one control path indicates validity of data input to the selected processing stage and at least one other control path is a stall release signal indicating a status of the state resource of the selected processing stage.

18. The method of claim 17, wherein the stall point of the selected processing stage allows a new data set to propagate to the state resource after receiving an indication that the state resource has been released and that data provided to the selected processing stage is valid, wherein the indication is the stall release signal.

19. The method of claim 14, wherein the hardware description of the stall circuit specifies a time independent AND gate.

* * * * *